(12) United States Patent
Saini (10) Patent No.: US 7,352,647 B1
(45) Date of Patent: Apr. 1, 2008

(54) REDUCED POWER USAGE IN A MEMORY FOR A PROGRAMMABLE LOGIC DEVICE

(75) Inventor: Rahul Saini, Union City, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/317,324

(22) Filed: Dec. 22, 2005

(51) Int. Cl.
*G11C 8/00* (2006.01)

(52) U.S. Cl. ............... 365/230.03; 365/189.01; 365/230.06

(58) Field of Classification Search ............ 365/205, 365/230.03, 230.06, 230.08; 326/37–40
See application file for complete search history.

(56) References Cited

U.S. PATENT DOCUMENTS 5,390,333 A * 2/1995 Pritt et al. ............... 713/324
6,127,843 A * 10/2000 Agrawal et al. ............. 326/40
6,462,998 B1 * 10/2002 Proebsting ................. 365/205

OTHER PUBLICATIONS

Azizi, Navid et al.; "Low-Leakage Asymmetric-Cell SRAM"; University of Toronto, 4 pages, unknown date.

"Memory technology information page";2005, ePanorama.net, http://www.epanorama.net/links/memory.html, 12 pages.

* cited by examiner

*Primary Examiner*—Gene N. Auduong
(74) *Attorney, Agent, or Firm*—Townsend and Townsend and Crew LLP (57) ABSTRACT

A method and system to reduce power usage of memory within a programmable logic device (PLD) is disclosed. In one embodiment, a memory block is formed from a plurality of memory sub-blocks. A data management circuit is used to programmably couple bitlines and/or wordlines to a selected number of memory sub-blocks necessary for respective read/write operations. During a respective read operation, the data management circuit uses row and/or column addresses to determine which memory bitlines and/or wordlines, and memory sub-blocks are essential in the read operation, leaving other non-essential bitlines and/or wordlines, and memory sub-blocks idle, thereby conserving power usage of the entire memory block. In one embodiment, a during respective read operation, a series of programmable pass-gates are used to selectively de-couple bitlines and/or wordlines, and memory sub-blocks that are not essential to the read operation.

24 Claims, 6 Drawing Sheets

REDUCED POWER USAGE IN A MEMORY FOR A PROGRAMMABLE LOGIC DEVICE

BACKGROUND

The present invention relates to techniques for reducing power consumption in integrated circuits, and more particularly, to techniques for reducing power usage of memory circuits used in a programmable logic device.

Generally, programmable logic devices (PLD) such as field programmable gate arrays (FPGA), include thousands of programmable logic cells that use combinations of logic gates and/or look-up tables (LUTs) to perform a logic operation. Programmable devices also include a number of functional blocks having specialized logic devices adapted to specific logic operations, such as adders, multiply and accumulate circuits, and phase-locked loops (PLL). The logic cells and functional blocks are interconnected with a configurable switching circuit. The configurable switching circuit selectively routes connections between the logic cells and functional blocks. By configuring the combination of logic cells, functional blocks, and the switching circuit, a programmable device can be adapted to perform virtually any type of information processing function.

To facilitate programmability and self-contained operation, PLD circuits usually include a variety of embedded user-programmable and operational memory often referred to as random access memory (RAM) blocks. RAM blocks are available in many forms such as dynamic RAM (DRAM) blocks, static RAM (SRAM) blocks, video RAM (VRAM) blocks, nonvolatile RAM (NVRAM) blocks, and many more. Each type of RAM block is used for data storage but each type generally has different speed, power, footprint, and cost considerations. For example, a SRAM block is a fairly expensive but fast form of RAM that uses a number of transistors in the form of flip-flop circuit which holds each bit of memory. Due to transistor leakage, SRAM will hold its memory state as long as there is power, or until a write line changes its state. Often a SRAM block is coupled to a battery system to maintain the memory state if the main power is lost.

Such embedded memory blocks are important components in programmable devices. Embedded memory blocks allow for bulk data storage within the device without the need for time-consuming off-device memory accesses. Unfortunately, as a result of their extensive use, memory blocks often consume a substantial part of programmable devices' silicon area and between 10% and 20% of core dynamic power consumption in the average design, and a much higher proportion in some designs.

Despite the success of programmable logic, there is a continuing desire to provide greater functionality and flexibility, while at the same time reducing overall device power consumption. Unfortunately, increasing functionality and flexibility generally means increasing memory block size and therefore increasing power consumption. In particular, as memory blocks increases in size, in storage capacity, and in complexity to accommodate increasing performance requirements of modem PLDs, the drive current and static leakage of electrical components, such as transistors and capacitors, forming the memory blocks increases. Moreover, such drive current and static leakage problems are further exacerbated as PLD manufacturers move from conventional 90 micron technology toward 65 micron technology and beyond in an effort to reduce the size of the PLDs.

There is therefore a need for circuits and methods to reduce the power requirements of memory blocks without degradation of performance.

BRIEF SUMMARY

Embodiments of the present invention pertain to techniques and circuitry used to reduce the power usage of memory blocks. In one embodiment, a memory block of a PLD is partitioned into a plurality of memory sub-blocks. Bitlines and/or wordlines associated with each memory sub-blocks are coupled to the memory sub-blocks via a data control circuit. The data control circuit programmably connects bitlines and/or wordlines lines to each of the memory sub-blocks with respect to data read or data write operations as needed.

During a write operation, all of the memory sub-blocks are connected to the bitlines and/or wordlines. During a data read operation, the data control circuit connects bitlines and/or wordlines used only by memory sub-blocks necessary to perform the read operation. The data control circuit disconnects the bitlines and/or wordlines from those memory sub-blocks not essential to the read operation, leaving those disconnected bitlines and/or wordlines, and memory sub-block in an idle state. Since only necessary memory sub-blocks are connected to the active bitlines and/or wordlines, the capacitive load of the memory block is reduced. Accordingly, only those memory sub-blocks and bitlines used for the read operation are refreshed during a memory refresh cycle thereby reducing the memory block's dynamic power usage.

A better understanding of the nature and advantages of the present invention may be gained with reference to the following detailed description and the accompanying drawings.

DESCRIPTION OF EXEMPLARY EMBODIMENTS

Embodiments of the invention are directed to reducing power usage of memory blocks embedded in a programmable logic device (PLD) such as field programmable gate arrays (FPGA). Generally, memory blocks are used to store data required for at least some operations of a PLD. In one embodiment, one or more memory blocks are divided into two or more memory sub-blocks, each having a dedicated row or column address decoder. Each pair of memory sub-blocks are separated by a data control circuit. The data control circuit is capable of connecting read/write lines (e.g., bitlines and/or wordlines) to sub-memory block as needed. During a write operation, the data control circuit couples respective bitlines and/or wordlines associated with each of the memory sub-blocks together. During a read operation, only the bitlines and/or wordlines, and memory sub-blocks necessary for the read operation are connected, thereby leaving other memory sub-blocks and portions of the bitlines and/or wordlines disconnected and in an idle state. As only the necessary memory sub-blocks are coupled to the bitlines and/or wordlines required for the memory read operation, the amount of memory block to be refreshed after the read operation is reduced which reduces the dynamic power requirement of the memory block, thereby conserving power.

Figure 1:
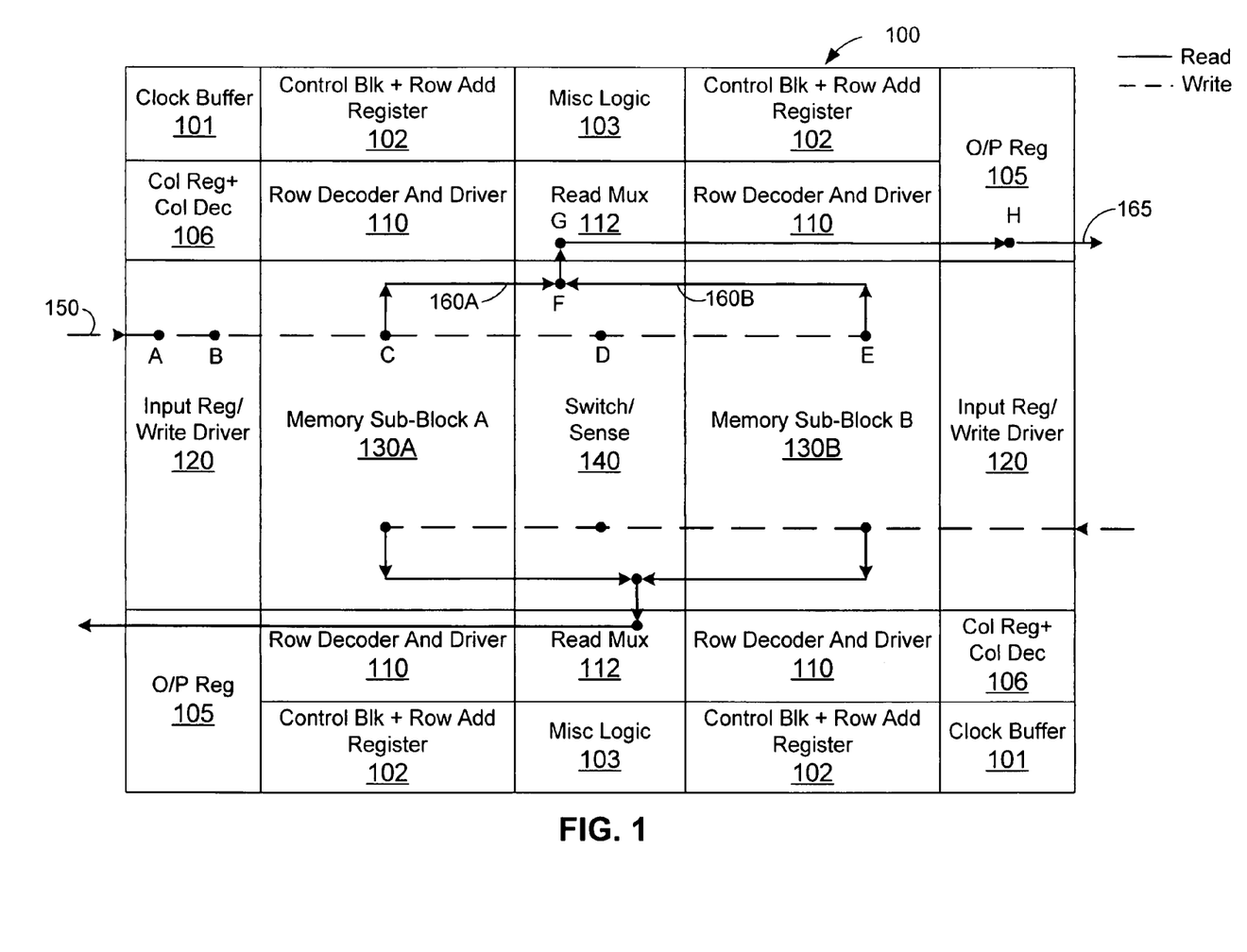
FIG. 1 illustrates a simplified schematic view of one embodiment of a memory block with a switch circuit in accordance with embodiments of the invention.

FIG. 1 illustrates a simplified schematic view of one embodiment of a memory block 100 including a data control circuit 140. Memory block 100 is illustrated as a SRAM having two halves (e.g., two memory sub-blocks) and combinational logic used to perform data read/write operations for each half. Memory block 100 is described for illustration purposes, those skilled in the art will appreciate that the present invention is not limited to such SRAM memory configurations, the combinational logic configuration, or the number or configuration of memory sub-blocks, bitlines, and wordlines used for memory read/write operations.

In one embodiment, the memory block 100 is formed with two memory sub-blocks, e.g., a left memory sub-block 130A and a right memory sub-block 130B, a power system for generating boosted voltage levels used by the left and right memory sub-blocks 130A and 130B, and control logic for buffering and generating timing signals, etc. For example, the memory block 100 includes clock buffer 101, control register 102, column register/decoder 106, row address decoder 110, read multiplexer 112, other logic 103, output registers 105, and input register 120. The left memory sub-block 130A is coupled to the input register 120 that is capable of coupling data from the left side of the memory block 100 into the left memory sub-block 130A or the right memory sub-block 130B. Similarly, the right memory sub-block 130B is coupled to an input register 120 that couples data from the right side of the memory block 100 into the right memory sub-block 130B or left memory sub-block 130A.

Generally, the left memory sub-block 130A and the right memory sub-block 130B are formed from a plurality of memory cells that are arranged in rows and columns. The plurality of memory cells are organized into wordlines and bitlines. For example, left memory sub-block 130A may be formed from 1 MB of memory cells organized into 512-wordlines (512 WL) by 2048-bitlines (2K BL). The row address register/control 102 and row decoder/driver 110 are used to access one of many wordlines. The column register/decoder 106 may be used to access one of many bitlines. The combination or wordlines and bitlines are used to access one or more memory cells for read/write operations as is known.

In one embodiment, memory block 100 also includes a data control circuit 140 disposed between the left memory sub-block 130A and the right memory sub-block 130B. The data control circuit 140 may include sense amps. Bitlines connect the sense amps to the memory cells. As is known, sense amps are used to determine (e.g., sense) the logic state of the memory cell. Sense amps are usually differential amplifiers that rely on a true and compliment input from the memory cell to determine the logic state of the memory cell as is known in the art. As described herein, the term logic state of the data at the memory block 100 inputs describes the logical state of the memory block inputs and outputs, logical "1" being a high voltage level and logical "0" being a low voltage level. Logical data is simply written as is, regardless of the bitline connection to the sense amp and its location in the memory sub-block 130A-B. The term physical data refers to the voltage level stored on the individual memory cells either in capacitive form and/or using transistors. When physical data is desired, the data is modified according to the bitline connection to either the true or complement side of the sense amp.

Each memory cell generally includes electrical elements such as resistors, capacitors, inductors, and transistors (e.g., NMOS, PMOS, etc.). The sense amps charge and discharge the memory cells through the bitlines. The power used to charge and discharge the memory cells during, for example, a memory refresh operation, is generally referred to as dynamic power and is affected by the electrical elements in the charge/discharge path of the bitline. The more bitlines that are used to access memory, the greater the dynamic power usage as the overall power required to refresh the memory block 100 increases. Power used to sustain the memory state is generally referred to as static power. Static power is generally related to power used to correct for continuous current leakage and for continuous power losses due to resistance in the electrical paths.

As described further below, the data control circuit 140 connects bitlines to the left memory sub-block 130A and to the right memory sub-block 130B as needed. In one embodiment, during a write operation, the data control circuit 140 is programmed to connect respective bitlines together to provide data write access to both the right memory sub-block 130A and to the left memory sub-block 130B. During a read operation, the data control circuit 140 is programmed to only connect right bitlines to the right memory sub-block 130A or left bitlines to the left memory sub-block 130B as needed, leaving the respective right or left memory sub-block 130A or 130B and their associated bitlines disconnected from the read operation.

In one operational embodiment, as illustrated in FIG. 1, during a write operation 150, data is received by the memory block 100 from, for example, data lines of a PLD. The data is received at location A of the input register 120. The data at location A is amplified at B and coupled from B to a memory location C of the left memory sub-block 130A or memory location E of the right memory sub-block 130B. The column address decoder 106 and row address decoder 110 are used to select the appropriate memory location C or E. If memory location E was selected, then the data must pass through the data control circuit 140, e.g., pass though location D.

During a subsequent read operation 160A or 160B, the data control circuit 140 decouples either the left memory sub-block 130A or the right memory sub-block 130B and their associated bitlines from the read operation. If the left memory sub-block 130A is used for the read operation (e.g., memory location C was used in the write operation), the data control circuit 140 decouples the right memory sub-block 130B and associated bitlines from the read operation. The sense amps use the active bitlines in the left memory sub-block 130A to sense the logic state of the memory cells in the left memory sub-block 130A. The logic sensed is then read though path 160A from memory location C though data control circuit 140, location F, stored in read register 112, location G, and then stored in output register 105 at memory location H for later use. In this example, only the bitlines used and the memory associated memory sub-block 130A during the read operation need be refreshed after the read operation. This is advantageous as power consumption during the read operation associated with the left and the right memory sub-block 130A-B is reduced with respect to the bitlines and memory sub-blocks not-used. For example, if half the memory block was used, only half of the memory block 100 is refreshed thereby reducing dynamic power requirements by about half.

Figure 2:
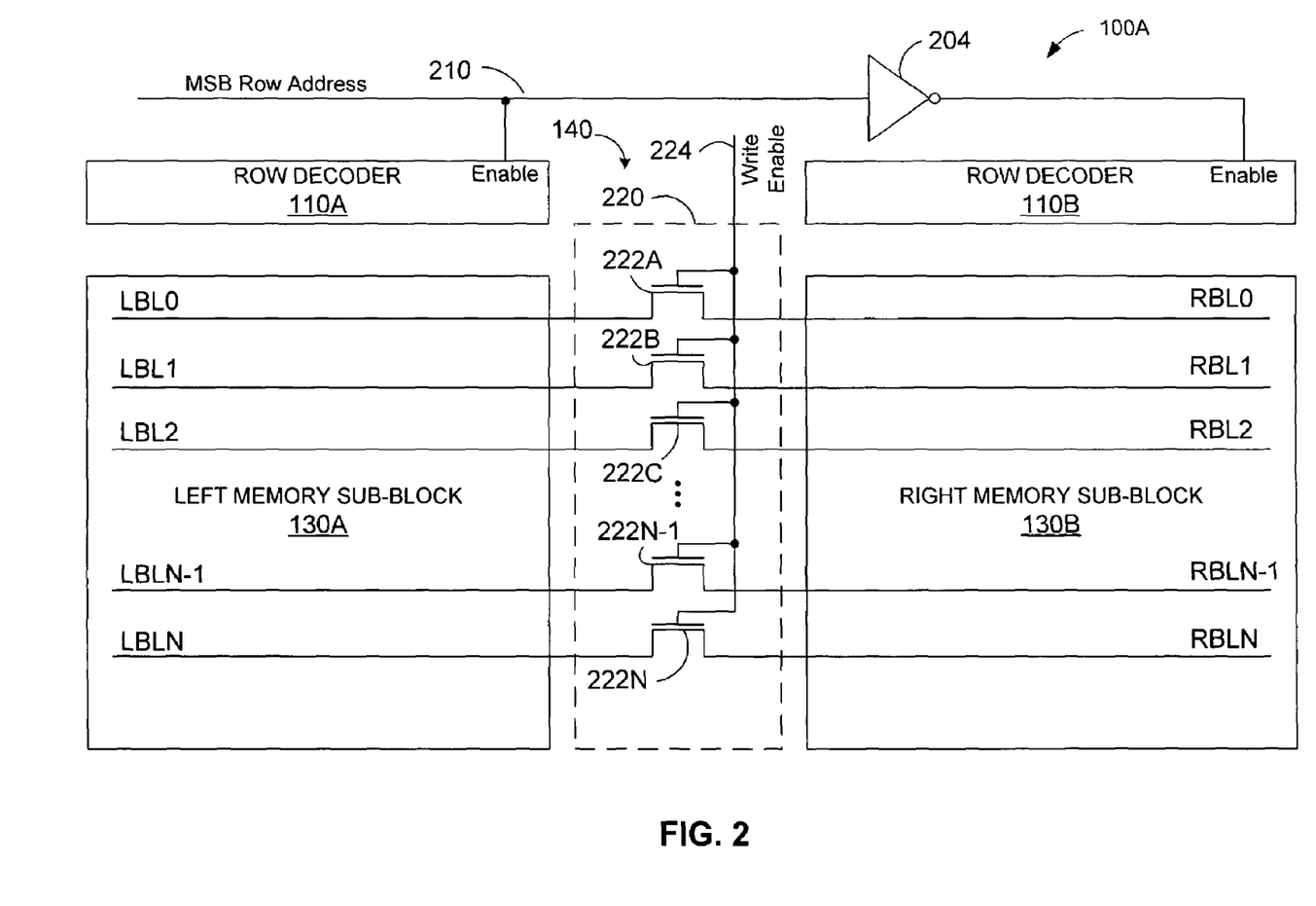
FIG. 2 illustrates a simplified schematic view of one embodiment of the memory block and switch circuit of FIG. 1 in a horizontal memory configuration, in accordance with embodiments of the invention.

FIG. 2 illustrates a simplified schematic view of one embodiment of the memory block 100 and data control circuit 140 of FIG. 1 in a horizontal memory configuration. In one embodiment, similar as described above, the memory block 100 is formed with a left memory sub-block 130A and a right memory sub-block 130B. Each of the memory sub-blocks 130A-B are formed from arrays of memory cells as described herein. A left row decoder 110A is used to select left bitlines LBL0 through LBLN of the left memory sub-block 130A, where N represents an "Nth" number. A right row decoder 110B is used to select right bitlines RBL0 through RBLN of the right memory sub-block 130B. The left bitlines LBL0-N are coupled to the right bitlines RBL0-N though data control circuit 140 via a switch circuit 220. Switch circuit 220 may be any type of switch that may be used to advantage such as an analog switching circuit, a switching circuit formed from combinational logic, operational amplifiers, and the like.

During a write operation, the write-enable line 224 may be used to couple the bitlines between the left and right memory sub-blocks 130A and 130B. During a read operation, the write-enable line 224 may be used to operate the switch 220 to connect the left bitlines LBL0-N to the right bitlines RBL0-N and therefore connect the left memory sub-block 130A and right memory sub-block 130B together for the write operation. For example, in one operational embodiment, during a write operation, the write-enable line 224 is set to logic high connecting the left bitlines LBL0-N and right bitlines RBL0-N together though the switch circuit 220.

To reduce dynamic power consumption, the switch circuit 220 may be used to disconnect the left memory sub-block 130A from the right bitlines RBL0-N, or the right memory sub-block 130B from the left bitlines LBL0-N. For example, in one operational embodiment, during a read operation in response to instructions from a processor or combinational logic of the PLD, the write-enable line 224 controls switch circuit 220 to decouple the left memory sub-block 130A and left bitlines LBL0-N from the right bitlines RBL0-N and right memory sub-block 130B, or the right memory sub-block 130B and right bitlines RBL0-N from the left bitlines LBL0-N and left memory sub-block 130A. This is advantageous as during the read operation only some of the memory and bitlines are coupled to respective left bitlines LBL0-N, or right bitlines RBL0-N, which reduces the dynamic power requirements required to discharge and refresh the memory block 100 by about the number of memory sub-blocks not being used. For example, in this illustration about one-half of the dynamic power is consumed as about one half of the memory sub-blocks are not being used. In another example, if two memory sub-blocks are not being used in a three sub-block system about two-thirds of the dynamic power consumption would be conserved.

In one embodiment, switch circuit 220 is configured with a plurality of transistors 222A-N used as pass gates. For example, NMOS transistor 222A may have one terminal (e.g., source) coupled to the right bitline RBL0 and another terminal (e.g., drain) coupled to the left bitline LBL0. The transistors 222A-N are configured to connect or disconnect respective left bitlines LBL0-N and right bitlines RBL0-N together via operation of the write-enable line 224 (e.g., transistor 222A provides a switchable connection between respective bitlines LBL0 and RBL0). The write-enable line 224 is coupled to the gate of each transistor 222A-N for operation thereof. During a write operation, the transistors 222A-N may be set via the write-enable line 224 to couple the bitlines RBL0-N and LBL0-N and therefore left and right memory sub-blocks 130A-B together though the respective transistors 222A-N. During a read operation, in response to instructions from, for example, a user, or a processor and/or combinational logic of the PLD, the write-enable line 224 controls switch the transistors 222A-N to decouple the left bitlines LBL0-N and left memory sub-block 130A from the right bitlines RBL0-N, and the right memory sub-lock 130B, or the right bitlines RBL0-N and right memory sub-block 130B from the left bitlines LBL0-N and the left memory sub-lock 130A.

In another embodiment, to reduce power usage, the left row decoder 110A or right row decoder 110B may be enabled or disabled during a read or write operation. For example, the left row decoder 110A may be enabled and the right row decoder 110B may be disabled if during a read or write operation the left memory sub-block 130A is used, but not the right memory sub-block 130B. Similarly, the right row decoder 110B may be enabled and the left row decoder 110BA may be disabled if during a read or write operation, the right memory sub-block 130B is used but not the left memory sub-block 130A.

In one embodiment, a most significant bit (MSB) line 210 coupled to an enable input of the left row decoder 110A and to an enable input of the right row decoder 110B through inverter gate 204 is used to activate the left row decoder 110A or right row decoder 110B. In one configuration, the MSB line 210 uses the MSB of a row address to select left memory left row decoder 110A or the right row decoder 110B. For example, if the MSB of the row address was "1", the left row decoder 110A would be enabled and the right row decoder 110B would be disabled. Similarly, if the MSB of the row address was "0", the right row decoder 110B would be enabled and the left row decoder 110A would be disabled.

Figure 3:
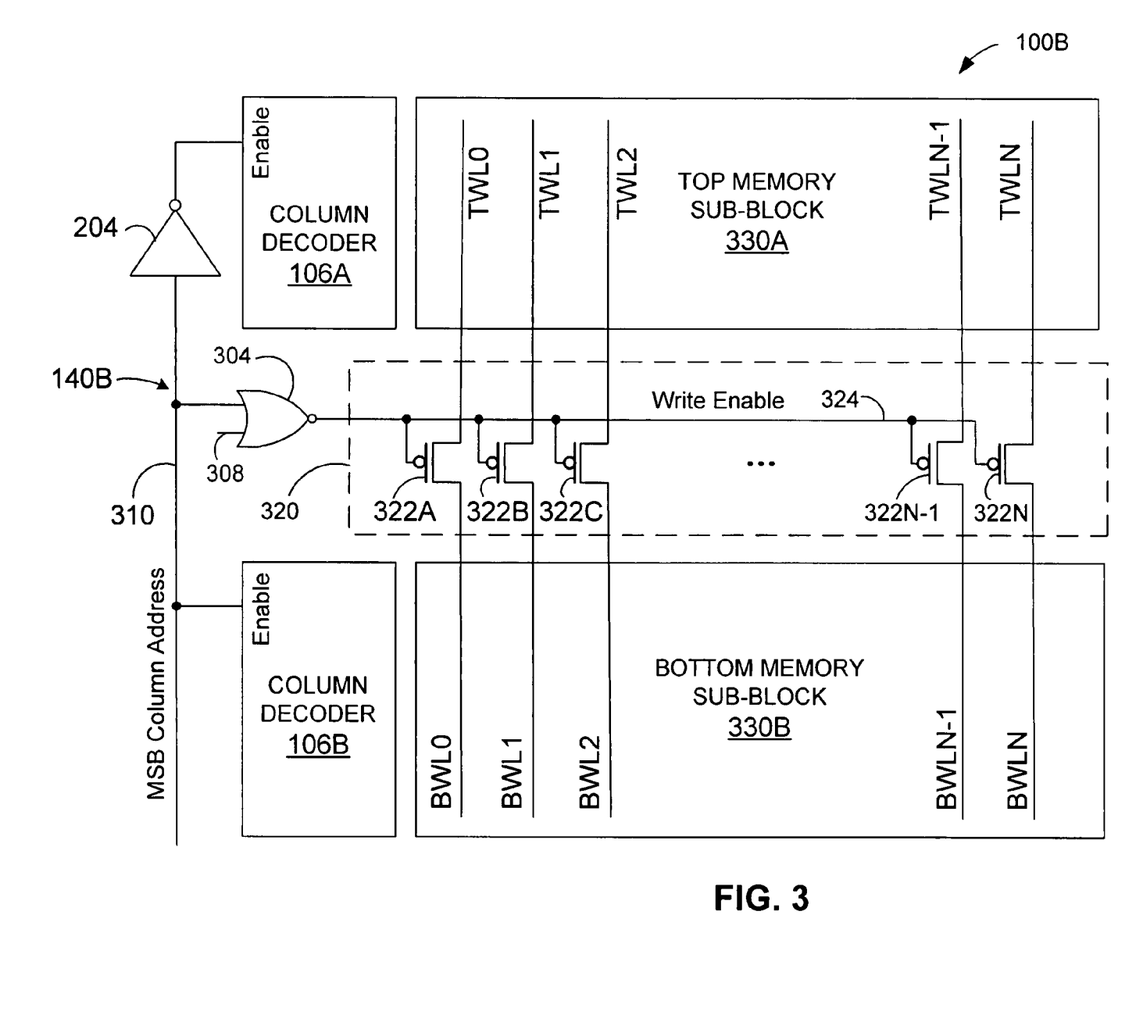
FIG. 3 illustrates a simplified schematic view of one embodiment of the memory block and switch circuit of FIG. 1 in a vertical memory configuration, in accordance with embodiments of the invention.

FIG. 3 illustrates a simplified schematic view of one embodiment of the memory block 100B and a data control circuit 140B in a vertical orientation. Similar to memory block 100 described above in a horizontal orientation, memory block 100B is placed in a vertical orientation which allows memory sub-blocks disposed above or below each other to be accessed via selectable bitlines and wordlines. In one embodiment, memory block 100B includes a top memory sub-block 330A and a bottom memory sub-block 330B. The top memory sub-block 330A and bottom memory sub-block 330B each are connected to respective bitlines and wordlines. For example, the top memory sub-block 330A is connected to top wordlines (TWL) and the bottom memory sub-block 330B is connected to bottom wordlines (BWL). A top column decoder 106A is used to select top wordlines TWL0 through TWLN of the top memory sub-block 330A. A bottom column decoder 106B is used to select bottom wordlines BWL0 through BWLN of the bottom memory sub-block 330B. Similar to data control circuit 140 described above, the data control circuit 140B includes a switch 320 used to connect or disconnect the top wordlines TWL0-N and the bottom wordlines BWL0-N. Switch 320 may be any type of switch that may be used to advantage such as an analog switching circuit, a switching circuit formed from combinational logic, operational amplifiers, and the like.

While it is contemplated that the top wordlines TWL0-N, and bottom wordlines BWL0-N may be accessed via circuitry positioned adjacent to the top or bottom wordlines, in one embodiment, the top wordlines TWL0-N may be accessed though the bottom wordlines BWL0-N and the bottom wordlines BWL0-N may be accessed through the top wordlines TWL0-N. In this case, the switch 320 may be set to allow the top wordlines TWL0-N to be accessed from circuitry disposed adjacent the bottom wordlines BWL0-N. Similarly, the switch 320 may be set to allow the bottom wordlines BWL0-N to be accessed from circuitry disposed adjacent the top wordlines TWL0-N. This is advantageous as it allows a user to configure the logic circuit at any location that is convenient.

In one embodiment, data control circuit 140B includes OR gate 304. The OR gate 304 has one input connected to the column decoder select line 310, and an enable input 308 responsive to combinational logic and/or the PLD. In one embodiment, the write-enable line 324 is operated via OR gate 304. In this configuration, an assertion of logic HIGH from either input to the OR gate 304 would set the write-enable line 324 to a logic LOW allowing switch 320 to connect the top wordlines TWL0-N and bottom wordlines BWL0-N together. Similarly, assertion of a logic LOW to either input of the OR gate 304 would set the write-enable line 324 to a logic HIGH allowing switch 320 to decouple the top wordlines TWL0-N and bottom wordlines BWL0-N.

In one embodiment, a MSB of a column address is used to select which wordlines to use. For example, in one operational embodiment, during a write operation where the enable input 308 is set to logic HIGH, the write-enable line 324 is set to logic LOW connecting the top wordlines TWL0-N and the bottom wordlines BWL0-N together though the switch 320. During a read operation, the enable input 308 is set to logic LOW allowing the MSB of the column address to select the top wordlines TWL0-N or the bottom wordlines BWL0-N.

To reduce dynamic power consumption of the memory block 100B, the switch 320 may be used to disconnect the top wordlines TWL0-N and therefore the top memory sub-block 330A from the bottom wordlines BWL0-N, or the bottom wordlines BWL0-N and therefore the bottom memory sub-block 330B from the top wordlines TWL0-N. For example, in one operational embodiment, during a read operation in response to instructions received for example, from the MSB of the column address received from a processor or combinational logic of the PLD, the write-enable line 324 controls switch 320 to decouple the top wordlines TWL0-N from the bottom wordlines BWL0-N. Therefore, depending on which wordlines are used, the top memory sub-block 130A and top wordlines TWL0-N may be decoupled from the bottom wordlines BWL0-N and bottom memory sub-block 330B, or the bottom wordlines BWL0-N and the bottom memory sub-block 330B may be decoupled from the top wordlines TWL0-N and top memory sub-block 330A during the read operation. This is advantageous as less of the memory block 100B is coupled to respective top wordlines TWL0-N, or bottom wordlines BWL0-N, only a portion of the wordlines and memory block 100B are used during the read operation, thereby reducing dynamic power requirements.

In one embodiment, similar to switch circuit 220 described above, switch 320 is configured with a plurality of transistors 322A-N used as pass gates. For example, PMOS transistor 322A may have one terminal (e.g., source) coupled to a top wordline (e.g., TWL0) and another terminal (e.g., drain) coupled to a corresponding bottom wordline (e.g., BWL0). The transistors 322A-N are configured to connect respective top wordlines TWL0-N and bottom wordlines BWL0-N together via operation of the write-enable line 324 (e.g., transistor 322A provides a connection between respective wordlines LBL0 and RBL0 in response to a logic signal on write-enable line 324). The write-enable line 324 is coupled to the gate of each transistor 322A-N for operation thereof. During a write operation, the transistors 322A-N may be set via the write-enable line 324 to couple the top wordlines TWL0-N and bottom wordlines BWL0-N together though the respective transistors 322A-N. During a read operation, in response to instructions from, for example, a user, or a processor and/or combinational logic of the PLD, the write-enable line 324 controls switch the transistors 322A-N to decouple the top wordlines TWL0-N and top memory sub-block 330A from the bottom wordlines BWL0-N, or the bottom wordlines BWL0-N and bottom memory sub-block 330B from the top wordlines TWL0-N.

To reduce power usage in the memory 100B, in one embodiment, the top column decoder 106A or bottom column decoder 106B may be enabled or disabled for a read or write operation. For example, the top column decoder 106A may be enabled and the bottom column decoder 106B may be disabled if during a read or write operation the top memory sub-block 330A is used, but not the bottom memory sub-block 330B. Similarly, the bottom column decoder 106B may be enabled and the top column decoder 106A may be disabled if during a read or write operation, the bottom memory sub-block 330B is used but not the top memory sub-block 330A. In one embodiment, the select line 310 coupled to an enable input of the bottom column decoder 106B and to an enable input of the top column decoder 106A through inverter gate 204 is used to select the top column decoder 106A or bottom column decoder 106B, and the corresponding top or bottom memory sub-block.

In one configuration, the select line 310 uses the MSB of the column address to select top wordlines TWL0-N or bottom wordlines BWL0-N. For example, if the MSB of the column address was "1", the bottom column decoder would be enabled and the top column decoder 106A would be disabled.

In one embodiment, FIGS. 2 and 3 may be combined such that a plurality of combinations of wordlines and bitlines may be programmably selected to access a desired portion of memory. This is advantageous as, for example, this embodiment allows a user to programmably access only a portion of memory required for a read operation with selected bitlines and/or wordlines, leaving the other non-required portions of wordlines and/or bitlines, and memory in an idle state, thereby reducing power consumption.

Figure 4:
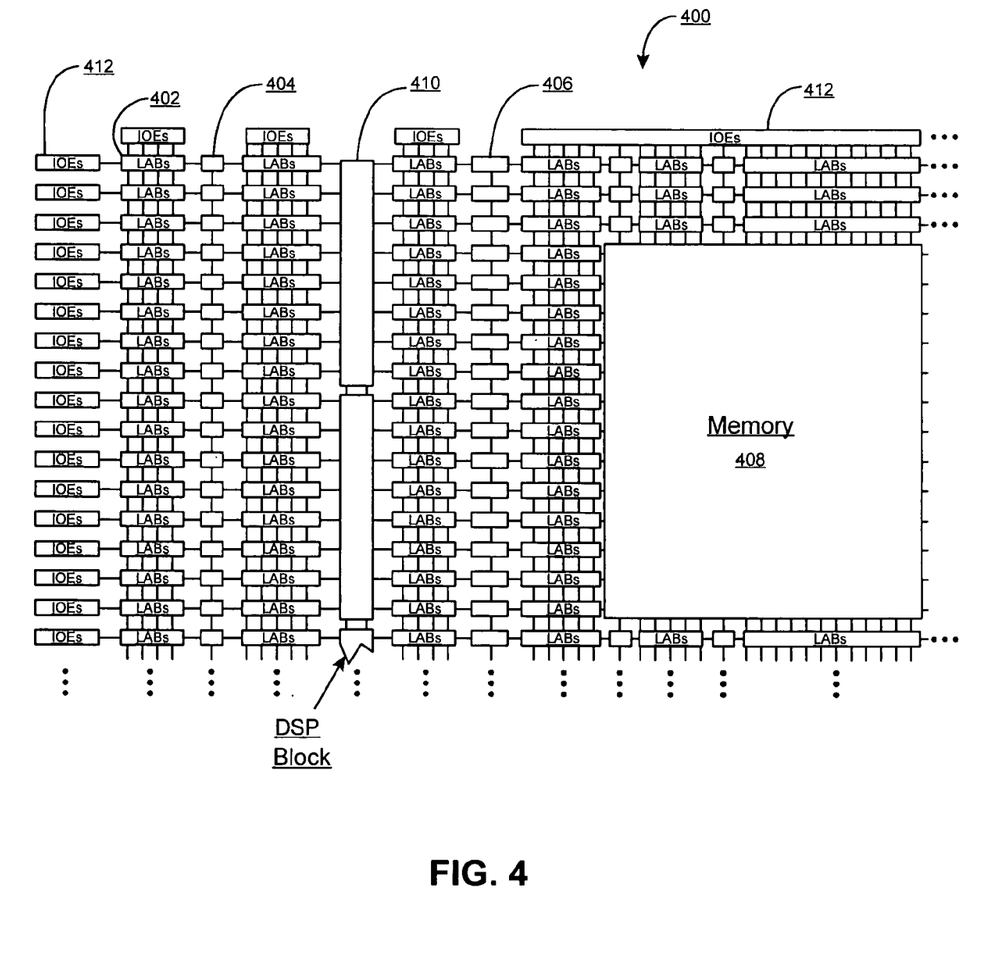
FIG. 4 is a simplified block diagram of a programmable logic device that can embody the techniques of the present invention.

FIG. 4 is a simplified partial block diagram of one example of PLD 400 that can include aspects of the present invention. It should be understood that the present invention can be applied to numerous types of integrated circuits including programmable logic integrated circuits, field programmable gate arrays, mask FPGAs, and application specific integrated circuits (ASICs). PLD 400 is an example of a programmable logic integrated circuit in which techniques of the present invention can be implemented. PLD 400 includes a two-dimensional array of programmable logic array blocks (or LABs) 402 that are interconnected by a network of column and row interconnects of varying length and speed. LABs 402 include multiple (e.g., 10) logic elements (or LEs).

An LE is a programmable logic block that provides for efficient implementation of user defined logic functions. A PLD has numerous logic elements that can be configured to implement various combinatorial and sequential functions. The logic elements have access to a programmable interconnect structure. The programmable interconnect structure can be programmed to interconnect the logic elements in almost any desired configuration.

PLD 400 also includes a distributed memory structure including RAM blocks of varying sizes provided throughout the array. The RAM blocks include, for example, 512 bit blocks 404, 4K blocks 406, and a block 408 providing 512K bits of RAM. These memory blocks can also include shift registers and FIFO buffers.

PLD 400 further includes digital signal processing (DSP) blocks 410 that can implement, for example, multipliers with add or subtract features. I/O elements (IOEs) 412 located, in this example, around the periphery of the device support numerous single-ended and differential I/O standards. It is to be understood that PLD 400 is described herein for illustrative purposes only and that the present invention can be implemented in many different types of PLDs, FPGAs, and the like.

Figure 5:
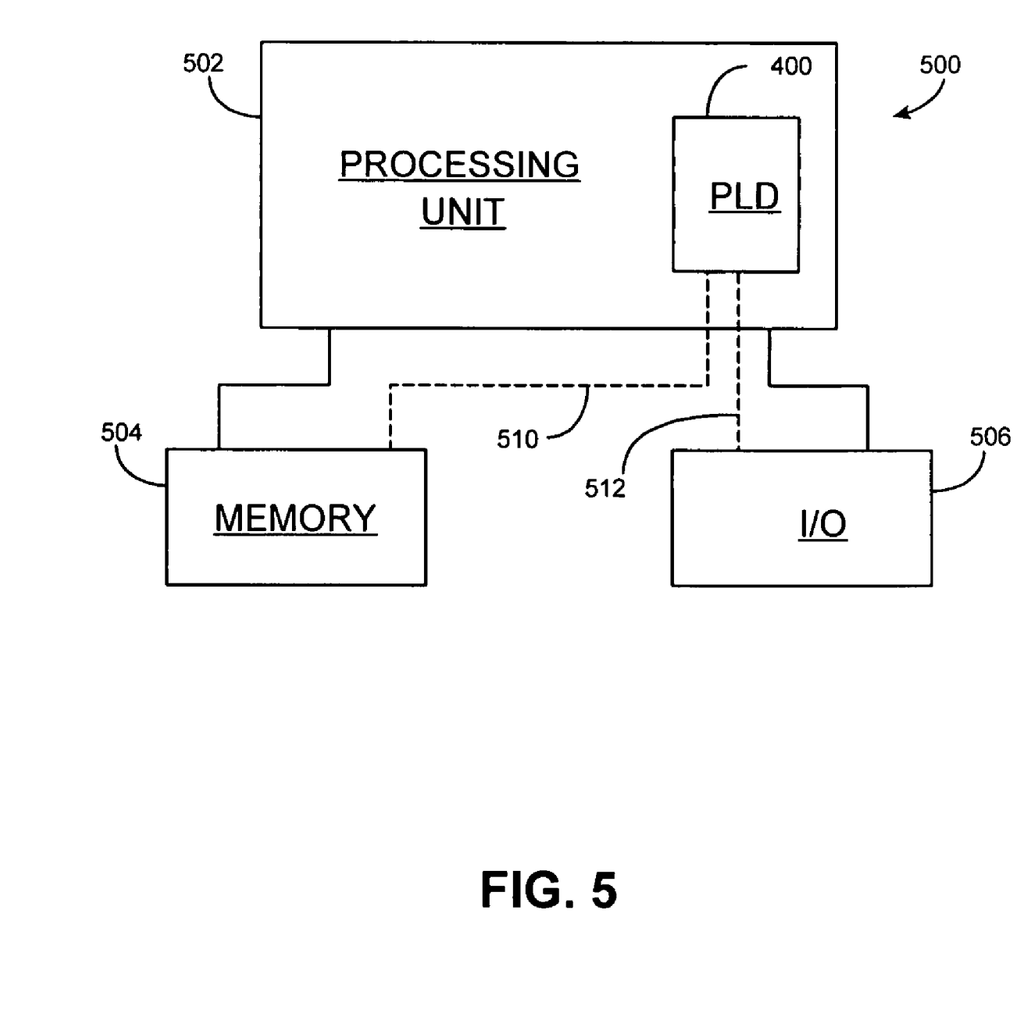
FIG. 5 is a simplified block diagram of an electronic system that can implement embodiments of the present invention.

While PLDs 400 of the type shown in FIG. 4 may provide many of the resources required to implement system level solutions, the present invention can also benefit systems wherein a PLD is one of several components. FIG. 5 shows a block diagram of an exemplary digital system 500, within which the present invention can be embodied. System 500 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 500 can be provided on a single board, on multiple boards, or within multiple enclosures.

System 500 includes a processing unit 502, a memory unit 504 and an I/O unit 506 interconnected together by one or more buses. According to this exemplary embodiment, a programmable logic device (PLD) 400 is embedded in processing unit 502. PLD 400 can serve many different purposes within the system in FIG. 5. PLD 400 can, for example, be a logical building block of processing unit 502, supporting its internal and external operations. PLD 400 is programmed to implement the logical functions necessary to carry on its particular role in system operation. PLD 400 can be specially coupled to memory 504 through connection 510 and to I/O unit 506 through connection 512.

Processing unit 502 can direct data to an appropriate system component for processing or storage, execute a program stored in memory 504 or receive and transmit data via I/O unit 506, or other similar function. Processing unit 502 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 400 can control the logical operations of the system. In an embodiment, PLD 400 acts as a reconfigurable processor, which can be reprogrammed as needed to handle a particular computing task. Alternately, PLD 400 can itself include an embedded microprocessor. Memory unit 504 can be RAM, SRAM, read only memory ROM, fixed or flexible disk media, PC Card flash disk memory, tape, or any other storage means, or any combination of these storage means.

Figure 6:
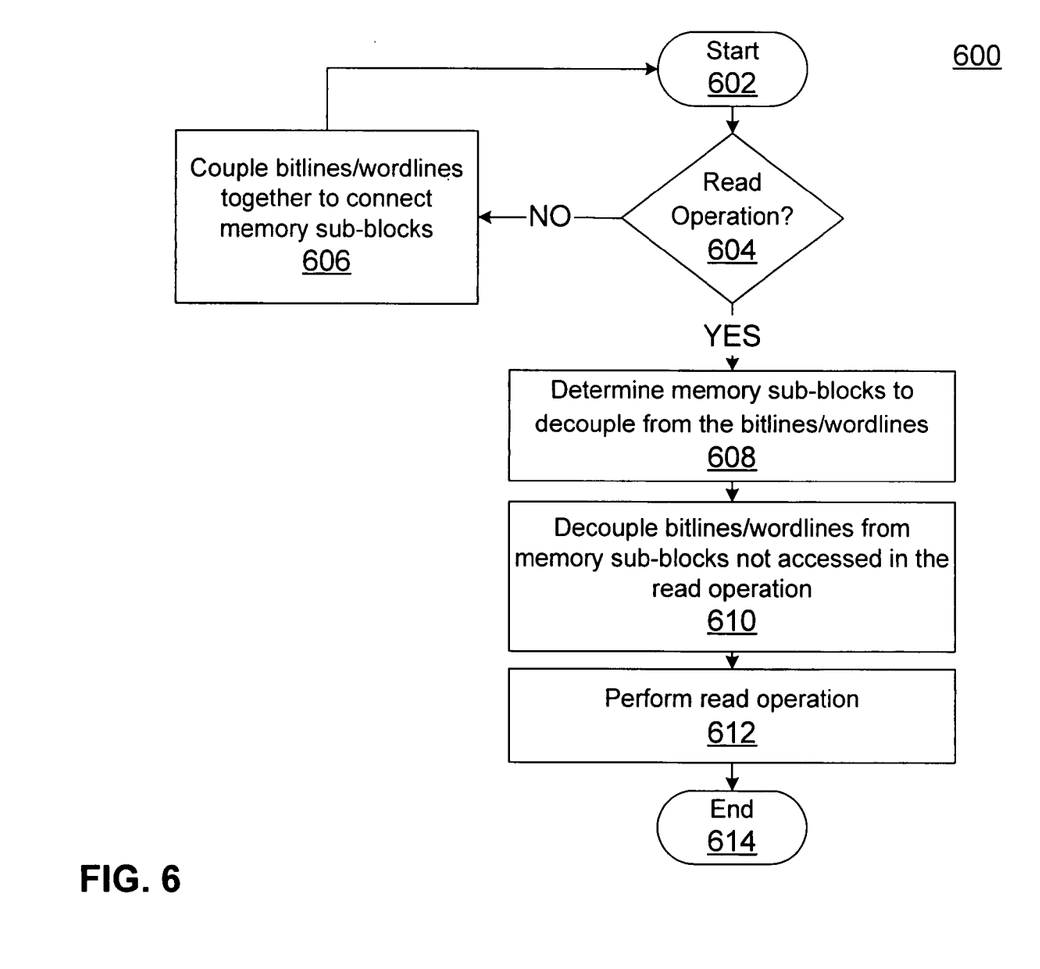
FIG. 6 is a flow diagram of a method of coupling data to memory sub-blocks during a read or write operation, in accordance with embodiments of the invention.

FIG. 6 is a flow diagram of one embodiment of a method 600 of decoupling memory sub-blocks and bitlines and/or wordlines that are not being used during a read operation. Method 600 starts at step 602, when for example, a read or write memory operation is initiated. If at step 604, the memory operation is a write operation where data is being stored, the bitlines and/or wordlines are connected together to connect the bitlines, and/or wordlines, and memory sub-blocks together at step 606 and a write operation is performed. For example, referring to FIG. 2, switch circuit 220 connects the left bitlines LBL0-N to the right bitlines RBL0-N, allowing data to be written to either the left memory sub-block 130A or the right memory sub-block 130B.

However, if at step 604 the memory operation was a read operation, the method 600 proceeds to step 608. At step 608, a determination is made as to which bitlines and/or wordlines to use during the read operation. For example, as illustrated in FIG. 2, if the left memory sub-block 130A is to be used during the read operation, then the write-enable line 224 would be set to a logic LOW to decouple the left bitlines LBL0-N from the right memory sub-block 130B. At step 610, the bitlines and/or wordlines, and memory not being used are decoupled from the memory, and/or wordlines and bitlines being used for the read operation and left in an idle state.

Once the bitlines and/or wordlines are decoupled, the read operation is performed at step 610. During the read operation 610 a physical data sense is done and a refresh is performed to refresh the memory used for the read operation. As described above, this is advantageous, as only a portion of the bitlines and/or wordlines, and memory sub-blocks participate in the read operation while the other non-used bitlines and/or wordlines, and memory are idle, reducing dynamic power consumption. The method 600 ends at step 612.

The foregoing description of specific embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A programmable logic device comprising:
a memory block having a plurality of memory sub-blocks;
a data control circuit that selectively connects charged read/write lines to one or more of the memory sub-blocks, wherein during a read operation the data control circuit connects charged read/write lines to only those memory sub-blocks necessary for the read operation,
wherein the data control circuit comprises a select line, wherein the select line causes the data control circuit to connect respective data read/write lines of at least two memory sub-blocks together in response to a signal indicative of connecting the data read/write lines, and wherein the signal comprises a most significant bit.

2. The programmable logic device of claim 1, wherein during a write data operation the data control circuit connects together respective read/write lines associated with the plurality of memory sub-blocks.

3. The programmable logic device of claim 1, wherein the read/write lines comprise bitlines or wordlines.

4. The programmable logic device of claim 1, wherein the data control circuit is a switch capable of connecting a first set of read/write lines associated with a first memory sub-block to a second set of read/write lines associated with a second memory sub-block.

5. The programmable logic device of claim 1, wherein the data control circuit comprises a transistor switch.

6. The programmable logic device of claim 1, wherein data control circuit decouples at least one data read/write line not used for the read operation.

7. The programmable logic device of claim 1, further comprising at least one address decoder capable of being enabled when needed and disabled when not needed.

8. An integrated circuit comprising:
a memory block having a plurality of memory sub-blocks;
a data switching circuit that selectively connects charged read/write lines to the plurality of memory sub-blocks, wherein during a read operation the data switching circuit decouples at least some of the read/write lines and memory sub-blocks not needed to perform the read operation;
wherein during a write data operation that writes data received on data lines extending from an external device into the memory block, the data switching circuit connects together respective read/write lines associated with the plurality of memory sub-blocks.

9. The integrated circuit of claim 8, wherein the read/write lines comprise bitlines.

10. The integrated circuit of claim 8, wherein the read/write lines comprise wordlines.

11. The integrated circuit of claim 8, wherein the data switching circuit comprises transistors, wherein each transistor provides a switching connection between a respective first bitline and a respective second bitline.

12. The integrated circuit of claim 8, wherein the data switching circuit comprises transistors, wherein each transistor provides a switching connection between a respective first wordline and a respective second wordline.

13. The integrated circuit of claim 8, wherein the data switching circuit comprises at least one transistor pass-gate.

14. The integrated circuit of claim 8, wherein the data switching circuit comprises a select line responsive to a logic signal, wherein when the logic signal is indicative of coupling the read/write lines, the select line causes the data switching circuit to couple at least some respective read/write lines together.

15. A method of reducing power consumption in a memory circuit, the method comprising:
during a memory read operation, determining a first set of read/write lines associated with a first portion of the memory circuit used for the data read operation;
determining a second set of read/write lines associated with a second portion of the memory circuit not used for the data read operation; and
decoupling the second set of read/write lines from the first set of read/write lines during the data read operation, wherein decoupling the second set of read/write lines from the first set of read/write lines comprises providing a switch between at least a first wordline and a respective second wordline.

16. The method of claim 15, wherein determining the first set of read/write lines comprises determining which memory sub-block is required for the memory read operation.

17. The method of claim 15, wherein determining the second set of read/write lines comprises determining which memory sub-block is required for the memory read operation.

18. The method of claim 15, wherein decoupling the second set of read/write lines from the first set of read/write lines comprises providing a switch between at least a first bitline and a respective second bitline.

19. The method e of claim 15, wherein decoupling the second set of read/write lines from the first set of read/write lines comprises isolating at least some of the bitlines used for the memory read operation from bitlines not used for the memory read operation.

20. The method of claim 15, wherein decoupling the second set of read/write lines from the first set of read/write lines comprises isolating at least some of the wordlines used for the memory read operation from wordlines not used for the memory read operation.

21. The method of claim 15, wherein decoupling the second set of read/write lines from the first set of read/write lines comprises isolating at least some of the memory sub-blocks used for the memory read operation from memory sub-blocks not used for the memory read operation.

22. The method of claim 15, wherein only one switch is used between the first wordline and the second wordline.

23. The method of claim 15, wherein the data switching circuit consists of only one transistor pass-gate.

24. The method of claim 15, further comprising:
determining a third set of read/write lines associated with a third portion of the memory circuit used for the data read operation;
determining a fourth set of read/write lines associated with a fourth portion of the memory circuit not used for the data read operation; and
decoupling the fourth set of read/write lines from the third set of read/write lines during the data read operation, wherein decoupling the fourth set of read/write lines from the third set of read/write lines comprises providing a switch between at least a first bitline and a respective second bitline.

* * * * *